United States Patent

[11] 3,632,864

[72] Inventor Wayne Wheeler Evans
Indianapolis, Ind.
[21] Appl. No. 829,392
[22] Filed June 2, 1969
[45] Patented Jan. 4, 1972
[73] Assignee RCA Corporation

[54] SIGNAL SEEKING SYSTEM FOR RADIO RECEIVERS WITH TUNING INDICATING CIRCUITRY FOR CONTROLLING THE SIGNAL SEEKING
11 Claims, 2 Drawing Figs.

[52] U.S. Cl. .......... 178/5.8 R, 325/469, 325/471, 334/24
[51] Int. Cl. .......... H04m 5/60
[50] Field of Search .......... 178/6, DIG. 15, 5.8; 325/469, 470, 471; 334/24, 25

[56] References Cited

UNITED STATES PATENTS

| | | | |
|---|---|---|---|
| 2,798,150 | 7/1957 | Tate et al. | 325/471 |
| 2,875,329 | 2/1959 | Paul et al. | 325/470 |
| 3,388,215 | 6/1968 | Mayle | 325/471 |
| 2,452,878 | 11/1948 | Tittle | 334/25 |
| 3,334,187 | 8/1967 | Pampel | 334/24 |

*Primary Examiner*—Robert L. Griffin
*Assistant Examiner*—Donald E. Stout
*Attorney*—Eugene M. Whitacre

ABSTRACT: A television signal seeking system includes a UHF tuner driven by a bidirectional motor. The motor windings are energized through transistor switching circuits which are coupled to signal sensing circuits. Once the motor switch circuits are actuated the motor will drive the tuner through the television frequency spectrum until a stopping signal is applied to the motor switch circuits to deenergize the motor. The stopping signal is developed in response to (1) the presence of a train of horizontal sync pulses; (2) the presence of a predetermined level of automatic gain control voltage; and, (3) the presence of a change of automatic fine tuning correction voltage, when the tuning elements are driven into the pull-in range of the automatic fine tuning circuits.

PATENTED JAN 4 1972 3,632,864

Figure 1:
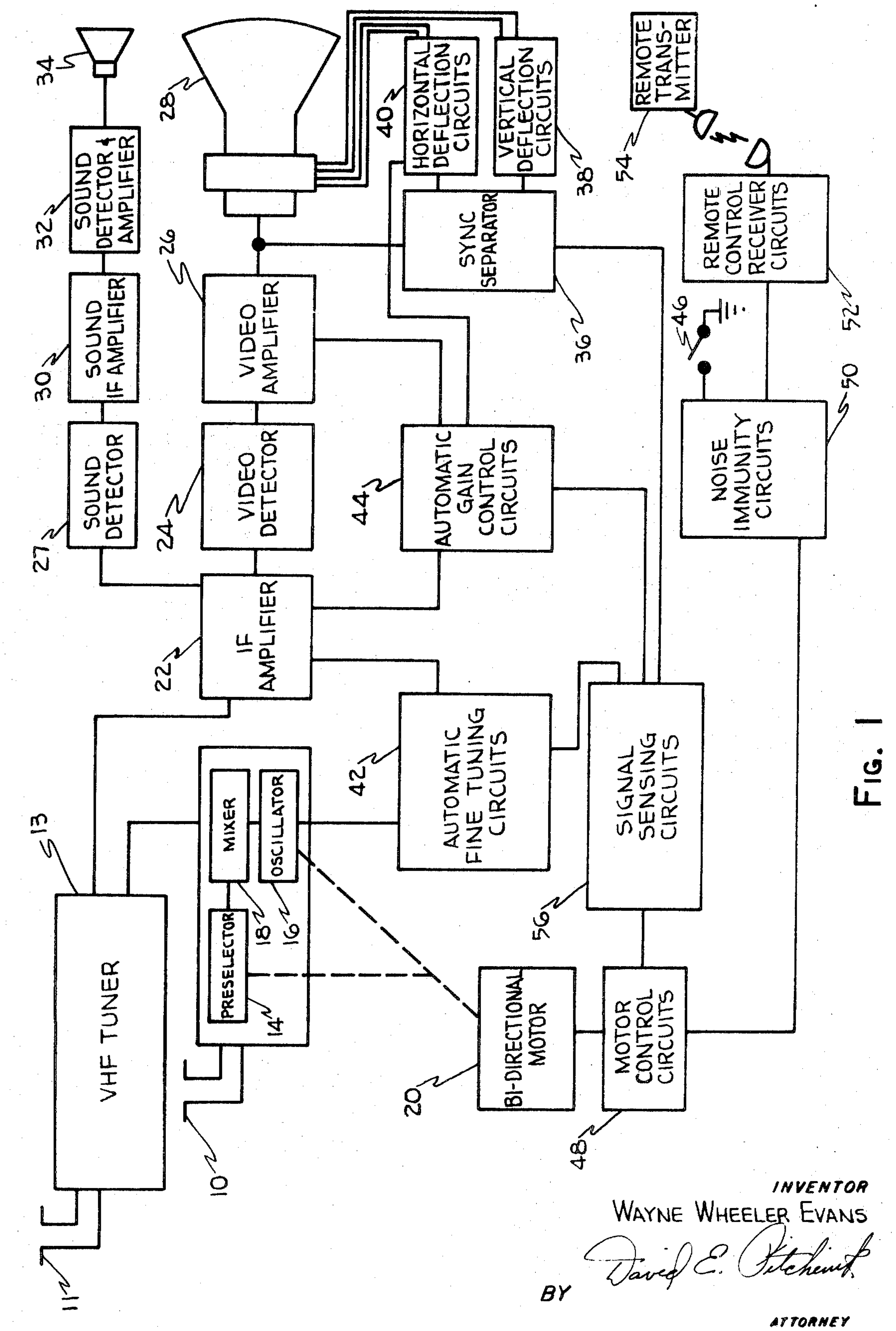

INVENTOR
WAYNE WHEELER EVANS
BY David E. Pitchenik
ATTORNEY

PATENTED JAN 4 1972

3,632,864

INVENTOR
WAYNE WHEELER EVANS

BY David E. Pitchenik

ATTORNEY

SIGNAL SEEKING SYSTEM FOR RADIO RECEIVERS WITH TUNING INDICATING CIRCUITRY FOR CONTROLLING THE SIGNAL SEEKING

The present invention relates to signal seeking tuning systems, and more particularly to a signal sensing circuit for use in a signal seeking tuning system for television receivers.

Various types of signal seeking television systems have heretofore been proposed, as for example, the system shown in the patent granted to W. F. Dietz, U.S. Pat. No. 3,130,264. Systems of this type employ a motor to drive the tuning elements in the television through the frequency spectrum. A signal sensing circuit detects the presence of a television signal being received and actuates a control circuit to stop the motor so that the receiver tuning elements will be tuned to the received signal.

One problem with signal seeking systems of this type is that the signal sensing circuits are actuated when the receiver tuning elements are tuned to the incoming television signal frequency. The inertia of the mechanical system continues to adjust the receiver tuning elements after the signal is sensed causing the final tuning of the receiver to be somewhat misadjusted.

A signal seeking tuning system embodying the invention includes a motor for driving the tuning circuit elements of a superheterodyne receiver over the frequency range of the receivers. Control circuitry for stopping the motor when the receiver is properly tuned to a received signal includes a frequency discriminator circuit. The frequency discriminator circuit detects the intermediate frequency and provides a control voltage having an amplitude which varies with frequency over a predetermined limited range of frequencies, the approximate center of which indicates the desired intermediate frequency, and which has a relatively constant amplitude outside said range of frequencies. As the receiver is tuned over its frequency range, the change in control voltage amplitude indicates that the receiver IF is within the limited range of frequencies and the motor is deenergized. The mechanical inertia of the system continues to adjust the tuning elements to tune to the desired frequency.

In accordance with an embodiment of the invention, a signal seeking tuning system for television receivers of the type including tuning means for scanning the frequency spectrum and selecting any one of a plurality of television channels includes driving means coupled to drive the tuning means to scan through the frequency spectrum. A control circuit means is coupled to deenergize the driving means to stop the tuning means when the control circuit means are actuated by a control signal. The control signal is produced in response to three criteria: (1) the presence of horizontal sync pulses; (2) the presence of a predetermined level of automatic gain control voltage; and (3) the presence of a control voltage from the automatic fine tuning control circuitry indicating that the receiver is tuned to a frequency within the built-in range of the automatic fine tuning control circuitry.

Figure 2:
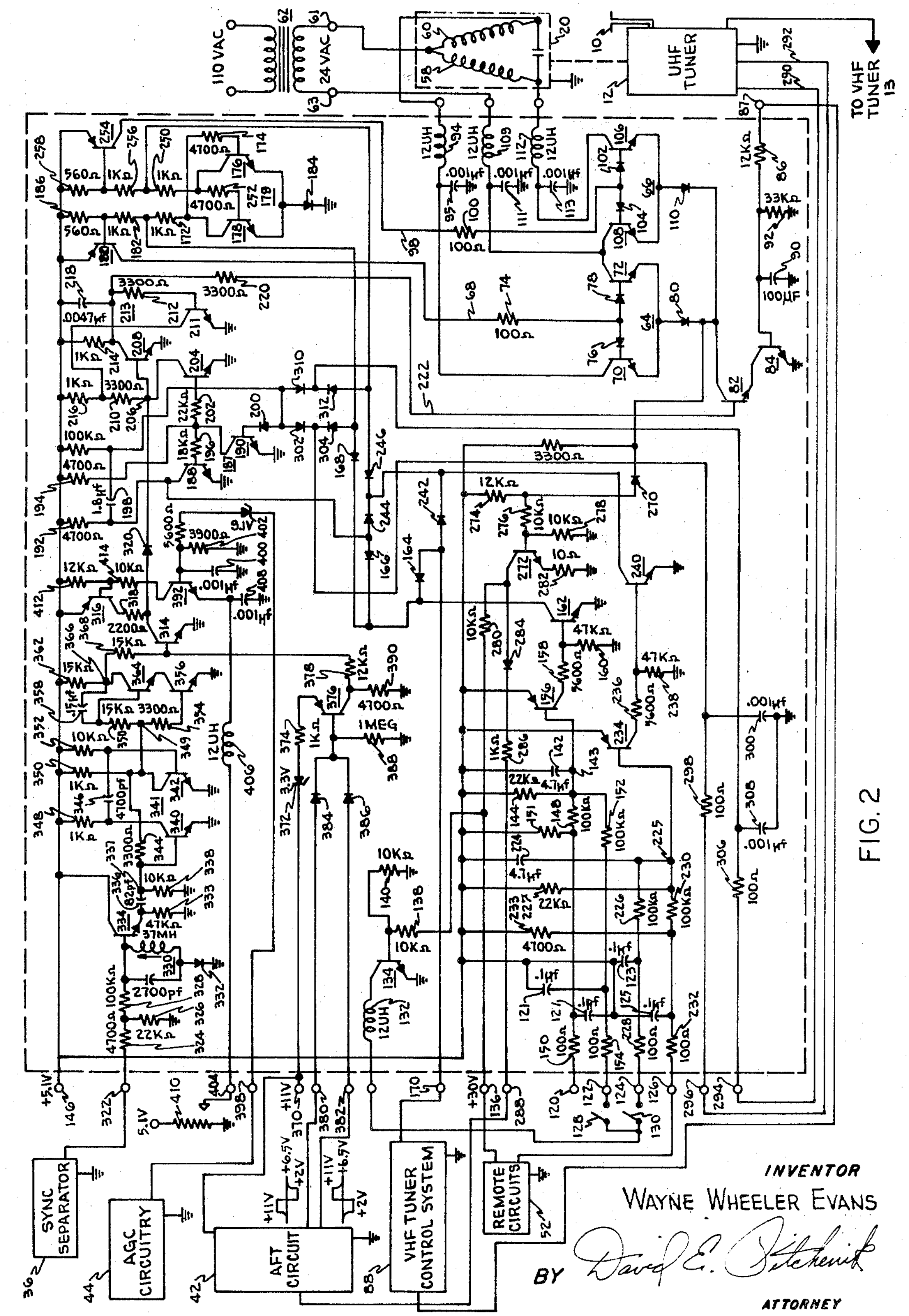

A complete understanding of the invention may be obtained from the following detailed description of a specific embodiment thereof, when taken in conjunction with the accompanying drawing, in which:

FIG. 1 is a block diagram of a signal seeking television tuning system embodying the present invention; and FIG. 2 is a schematic diagram of circuitry incorporated in the signal seeking tuning system shown in FIG. 1.

Referring now to the drawing, FIG. 1 illustrates a television receiver which includes a signal seeking tuning system in accordance with the invention. The television receiver may be an RCA Corporation CTC-40 series color television chassis which is shown in the "Television Service Data," File 1968, No. T20, published by RCA Sales Corporation, 600 North Sherman Drive, Indianapolis, Indiana. The television receiver shown in the block diagram of FIG. 1 is greatly simplified and does not purport to show all of the circuitry of a television chassis.

An antenna 10 for intercepting television signals in the ultrahigh frequency (UHF) band is coupled to a UHF tuner 12. The UHF tuner 12 includes a resonant UHF preselector 14 and a local oscillator 16 for generating heterodyning signals. Both the preselector 14 and the local oscillator 16 are coupled to a mixer circuit 18 which heterodynes the received television signals and the locally generated signal to provide a correspondingly modulated signal of intermediate frequency (IF). Both the preselector 14 and the oscillator 16 include continuously variable tuning elements which are ganged for movement together and coupled to be driven by a motor 20.

A second antenna 11 for intercepting very high frequency (VHF) signals is coupled to a VHF tuner 13. The VHF tuner is switched to select any one of the VHF television channels 2–13, and may also be switched to a position to amplify IF signals from the UHF tuner 12.

The VHF tuner 13 either converts received VHF signals to the receiver IF or amplifies IF signals from the UHF tuner 12 and applies them to an IF amplifier 22. The IF amplifier 22 is coupled to a video detector 24 which derives a composite video signal which is amplified by a video amplifier 26 and applied to a picture tube 28.

An intercarrier sound signal, produced by the interaction of the picture and sound intermediate frequency signals is detected by a separate intercarrier sound detector 27 and then applied to a sound intermediate frequency amplifier 30. The amplifier 30 is tuned to the 4.5 megacycle frequency of the intercarrier sound signal, which is the fixed frequency separating the picture carrier from the sound carrier in a typical transmitted television signal. The amplified sound IF output from the amplifier 30 is demodulated and amplified in a sound demodulation and audio amplifier stage 32 before application to a loudspeaker 34.

The composite video signal is also applied from the video amplifier 26 to a synchronizing signal separator 36. The separator 36 separates the vertical synchronizing pulses and applies them to vertical deflection control circuits 38 to control the vertical deflection of the cathode-ray beam in the picture tube 28. The separator 36 also separates and applies the horizontal synchronizing pulses to horizontal deflection control circuits 40 to control the horizontal deflection of the cathode-ray beam in the picture tube 28.

Automatic fine tuning circuits 42 are coupled between the IF amplifier 22 and the UHF tuner 12. The automatic fine tuning circuits develop a correction voltage which, over a predetermined frequency range, varies as a function of the resultant intermediate frequency and applies this voltage to a variable capacitance device to adjust the oscillator frequency so that the tuning of the resultant IF signal will be at the desired frequency. A keyed automatic gain control (AGC) circuit 44 is coupled to the video amplifier 26 and horizontal deflection circuits 40 to develop an AGC voltage which varies in amplitude as a function of the level of received television signal. The AGC voltage is applied to the IF amplifier 22, and to the radio frequency amplifier stage in the VHF tuner 13, the latter connection is not shown.

The circuits which have been described thus far are known circuits utilized in present day commercial television receivers, such as the CTC-40 color television chassis cited above.

To energize the bidirectional motor 20 to drive the UHF tuner shaft and thereby tune the preselector and oscillator tunable resonant circuits across the UHF frequency band, a switch 46 is depressed. The switch is coupled to a motor control circuit 48 through a noise immunity circuit 50. The noise immunity circuit prevents the presence of spurious signals which may be introduced into the system through the remote control receiver circuits 52 from erroneously actuating the system. The bidirectional motor 20 can also be energized by the transmission of a signal at a location remote from the receiver by a remote transmitter 54. The transmitted signals are received by the remote control receiver circuits 52 and applied through a noise immunity circuit 50 to the motor control circuit 48, thereby causing the motor to run.

A signal sensing circuit 56 is connected to the motor control circuit 48 and provides a signal to the motor control circuit which will stop the bidirectional motor 20 when the signal sensing circuits have determined the presence of a desired television signal. The signal sensing circuits 56 are responsive to horizontal sync pulses from the sync separator 36, the AGC voltage from the AGC circuits 44, and the AFT voltages from the AFT circuit in determining when to provide the signal to the motor control circuit 48.

FIG. 2 shows the motor control circuits 48 and the signal sensing circuits 56 in greater detail, with the circuits associated therewith shown in block form. Essentially, the motor control circuits 48 comprise three switching means connected in series. All three switches must be closed before the motor is energized. The first switching means comprises a pair of switches 64 and 66 which determine the direction of rotation of the motor. The only two switches comprise the transistors 82 and 84. When one of the switches 64 and 66 is closed, and the switches 82 and 84 are closed, the motor 20 is energized to drive the UHF tuner to tune to the next higher or lower channel in the UHF television band.

To change UHF channels a pair of manual control buttons 128 and 130 are provided which permit tuning to the next higher or lower channel in the UHF television band, respectively. Corresponding switching means are provided for remote actuation. When one of the manual control buttons is depressed, circuit means is actuated to cause the VHF tuning system to be switched to a position to amplify IF signals from the UHF tuner 12. When the VHF tuner is so switched, a control voltage is provided through terminal 87 to close the switch comprised by the transistor 84. In addition, one of the switches 64 and 66 is closed depending on which of the manual control buttons 128 and 130 is actuated. Still further, actuation of the manual control button causes a bistable multivibrator 213 to close the switch comprised of the transistor 82. Time delay means are associated with the multivibrator circuit 213 to insure that the switch 82 is closed for a sufficient period of time that the motor can drive the UHF tuner away from a previously selected UHF television channel. Still further, the AFT circuits are prevented from affecting the tuning of the UHF tuner 12.

The multivibrator circuit 213 referred to is also responsive to a voltage from the signal sensing circuit 56 (FIG. 1) to open the switch comprised of the transistor 82 when a UHF television channel of predetermined signal strength is received. The signal sensing circuits 56, as mentioned above, are responsive to horizontal sync pulses from the sync separator 36, the AGC voltage from the AGC circuits 44, and the AFT voltages from the automatic fine tuning circuits 42. The horizontal synchronizing pulses are integrated to provide a control voltage after a sufficient number of pulses have been received. The control voltage is applied to one input terminal of a gate circuit 314–316. The AGC voltage and an adjustable DC voltage providing a sensitivity control, is applied to another input terminal of the gate circuit. A control voltage which is developed in response to the automatic fine tuning circuit 42 operation is applied to a third input terminal of the gate circuit.

The automatic fine tuning circuit provides a control voltage which varies as a function of the frequency of the IF television signal. The control voltage increases (or decreases) in amplitude from a first value as the frequency of the IF signal changes from its desired value. When the frequency of the IF signal is outside pull-in range of the automatic fine tuning circuit 42 the control voltage is at its first value.

As the UHF tuner scans the UHF television frequency band the control voltage produced by the AFT circuit 42 will change abruptly when a transmitted UHF television signal causes an IF signal which is within the pull-in range of the AFT circuit 42. If horizontal synchronizing information and AGC voltage of sufficient magnitude are present, the gate circuit causes the bistable multivibrator 213 to change states and open the switch comprised of the transistor 82 to stop the motor 20. The inertia of the mechanical system will bring the motor and the UHF tuning control elements to the desired frequency.

During the tuning operation the automatic fine tuning circuit is not effective to control the UHF tuner 12. Once the motor 20 is deenergized, the automatic fine tuning circuit 42 is effective to control the frequency of the oscillator 16 in the UHF tuner 12 to produce an IF signal of the desired frequency.

As previously mentioned, the tunable resonant circuits of the UHF tuner 12 are mechanically ganged for rotation by the bidirectional AC motor 20. The motor 20 includes two windings 58 and 60, the common junction of which is coupled to one end 61 of the secondary winding of a transformer 62. The transformer primary winding is adapted to be energized by 110 volt AC line voltage to provide a 24 volt AC output across its secondary winding. The remaining end of the motor windings 58 and 60 are selectively connected to the other end 63 of the secondary winding of the transformer 62 through motor switching circuits 66 and 64, respectively.

To close the motor switching circuit 64 and energize the motor winding 60, a positive voltage is applied to the base electrodes of two transistors 70 and 72 via a conductor 68, a resistor 74 and a pair of diodes 76 and 78. The transistors 70 and 72 will be biased into conduction if the emitter electrodes of the transistors are electrically connected to ground for direct current. The path to ground for the emitter electrodes of the transistors 70 and 72 includes a diode 80, the collector-emitter current path of a transistor 82 and the collector-emitter current path of a transistor 84.

The base electrode of the transistor 84 is coupled by a resistor 86 and a terminal 87 to a VHF tuning control system 88. When the VHF tuner 13 (FIG. 1) is switched by the VHF tuning control system 88 to amplify IF signals from the UHF tuner 12, the VHF tuning control system 88 causes a positive voltage to be applied to the base electrode of the transistor 84. Conduction of the transistor 84 is delayed by approximately 200 milliseconds by the resistor 86 in combination with the parallel connection capacitor 90—resistor 92. This action provides an interlock between the VHF and UHF systems such that the UHF tuning motor cannot be caused to operate until the VHF system has established the proper conditions for UHF operation.

With the transistors 70 and 72 biased into conduction, an AC path is provided from the terminal 61 of the secondary winding through the winding 60, the inductor 94, the collector-emitter current path of the transistor 70, the emitter-collector current path of the transistor 72 and the inductor 109 to the second terminal 63 of the secondary winding. The alternating current flowing through the winding 60 causes the motor to run and tune the UHF tuner across the UHF frequency band in a first direction.

The tuner will tune across the UHF frequency band in the second direction when a positive potential is applied to the lead 98. The voltage is applied via a resistor 100 and two diodes 102 and 104 to the base electrodes of the transistors 106 and 108. As before, with a positive voltage applied to the base electrodes of transistors 106 and 108, and the transistors 82 and 84 biased for conduction, the bidirectional motor winding 58 is electrically connected across the secondary winding of the transformer 62 and the motor 20 will drive the UHF tuner 12 in the opposite second direction. The AC current path is from the first terminal 61 of the transformer through the motor winding 58, the inductor 112, the collector-emitter current path of the transistor 106, the emitter-collector current path of the transistor 108, the inductor 109 to the second terminal 63 of the transformer secondary winding. The inductors 94, 109, and 112 in conjunction with the capacitors 95, 111, and 113 provide protection against large transient spike voltages which may be induced by arcing in the television receiver.

It should be noted that when the system is actuated either remotely or manually the VHF system 88 will provide a positive voltage at the terminal 87 and a positive voltage is developed at one of the leads 68 and 98 as well as the base electrode of the transistor 82. The motor will begin to run and continue running until the transistor 82 is made nonconductive by a reverse bias which is applied to its base electrode when a desired UHF television signal is tuned in.

Four input terminals 120, 122, 124, and 126 are associated with the actuation of the motor 20. The input terminals are protected against high frequency transients (which may be associated with switch closings) by the capacitors 121, 123, 125 and 127 and their associated resistors 150, 154, 228 and 232 which provide high frequency filtering. A change in potential at any one of these four terminals will (a) cause the VHF tuner 13 to switch to operate as an amplifier for IF signals from the UHF tuner, (b) apply a turn on voltage to the transistor 84, (c) apply a positive voltage to one of the leads 68 and 98, and (d) apply a positive voltage to the base electrode of the transistor 82. A change in voltage at the terminals 120 and 122 controls the application of positive voltage to lead 68 and a change in voltage at the terminals 124 and 126 controls the application of positive voltage to lead 98. The voltage at terminals 120 and 126 may be controlled from a remote location by remote circuits 52. The remaining two terminals 122 and 124 are connected to switches 128 and 130 which may be positioned on the television chassis front panel for actuation by the viewer. The switches 128 and 130 are connected by a inductor 132 through the collector-emitter current path of a transistor 134 to ground. Bias for the transistor 134 is derived from a 30 volt potential applied to a terminal 136 through a voltage divider including the resistors 138 and 140.

In the present instance, the television chassis is designed to have a standby condition in which certain components such as the picture tube filaments are at least partially energized. Under these conditions no voltage is applied to terminal 136 and the normally conductive transistor 134 becomes nonconducting and the ground return for the switches 128 and 130 is removed. Thus, with the system in its standby condition, the switches 128 and 130 are made inoperative.

When the switch 128 is closed or the terminal 122 is brought to ground potential for a period of time, a capacitor 142, which is normally kept discharged by a parallel connected resistor 144, begins to charge from a 5.1 volt source of potential applied to a terminal 146. The capacitor charging path is from the terminal 146 through the capacitor 142 and through either of the resistors 148 and 150 associated with the terminal 120 or the resistors 152 and 154 associated with the terminal 122. The terminal 120 is coupled to the 5.1 volt potential at terminal 146 by resistor 150 and resistor 151 to provide operating potential for the output stage of the remote circuits 52. As the capacitor 142 begins to charge, the voltage at the junction 143 of the capacitor and the resistors 148 and 152 begins to drop. As the capacitor 142 continues to charge the voltage decreases to a point such that the transistor 156 whose base electrode is coupled to the junction becomes conductive. When this occurs, the voltage at the terminal 146 is applied through the emitter-collector path of the transistor 156 and via the voltage divider including the resistors 158 and 160 to the base electrode of a transistor 162 causing it to become conductive.

Conduction of the transistor 162 causes three diodes 164, 166, and 168 to become conductive. The diode 164 brings the terminal 170 to substantially ground potential to apply an input signal to the VHF tuning control system 88 such that it will switch the VHF tuner 13 to amplify IF signals from the UHF tuner 12. In turn the VHF tuning control system 88 causes a positive voltage to be applied to the terminal 87 associated with the base electrode of transistor 84.

When the diode 168 conducts the base electrode of transistor 176 is connected to ground via resistors 174 and 172, diode 168 and transistor 162. The transistor 176 and a second transistor 178 comprise a bistable multivibrator 179. When the transistor 176 becomes nonconductive, the transistor 178 becomes conductive. Conduction of the transistor 178 turns on the normally nonconductive transistor 180. The conduction of the transistor 180 causes the positive 5.1 volts at the terminal 146 to be applied to the base electrodes of transistors 70 and 72 causing the bidirectional motor 20 to rotate in one of its two directions.

Conduction of the diode 166 triggers a monostable multivibrator 187 including the transistors 188 and 190, along with their interconnecting components, the resistors 192, 194, 196, the capacitor 198, and the diode 200. In the astable state of the multivibrator, the normally conducting transistor 190 becomes nonconductive for a predetermined period of time. The positive voltage thereby developed at the collector electrode of the transistor 190 is applied via a resistor 202 to the base electrode of a transistor 204. The transistor 204, normally biased to be nonconducting, is biased into conduction for the duration of the positive voltage at the collector electrode of the transistor 190. For the component values shown in the drawing for the multivibrator 187, when triggered the monostable multivibrator will provide a 120 millisecond positive pulse output at the collector electrode of the transistor 190.

Conduction of transistor 204 causes the terminal 206 of the base electrode of a transistor 208 and a resistor 210 to be connected to ground through the collector-emitter current path of the transistor 204. At this point it should be noted that the detection of a desired television signal by the signal sensing circuits 56 ultimately causes a positive voltage to be applied to the terminal 206. This will be explained in greater detail hereinafter; however, it should be understood that the grounding of the terminal 206 is, for the remaining portion of the system, an indication that a desired UHF television signal is not present.

The transistor 208 and a second transistor 211 form a bistable multivibrator 213. Thus, the base electrode of the transistor 211 is connected to the collector electrode of the transistor 208 by a resistor 212, and the base electrode of the transistor 208 is connected to the collector electrode of the transistor 211 by the resistor 210. Operating potential for transistors 208 and 211 is obtained from the 5.1 volt source of potential at the terminal 146 through the resistors 214 and 216, respectively. As can be seen, the grounding of the terminal 206 causes the transistor 208 to become nonconductive and remain nonconductive for at least the duration of the conduction period of the transistor 204. The transistor 208 will remain nonconductive, thereafter, until a positive voltage is developed at the terminal 206. When the transistor 208 becomes nonconductive, the voltage at the collector electrode rises after the time delay afforded by the capacitor 218 and resistor 214 and is applied via a resistor 220 and lead 222 to the base electrode of the transistor 82.

This mechanism is provided so that when the UHF system is tuned for reception of a UHF television signal, and the terminals 120 or 122 are grounded to cause the system to run and seek out another UHF television signal, the signal sensing circuitry portion of the seeking signal system is disabled for a period of time which permits the motor 20 to drive the UHF tuner 12 away from its last tuning condition where all the criteria for stopping are present in the signal sensing circuits 56. The UHF tuner 12, once the motor 20 begins to run, will tune throughout the UHF frequency band until a desired television signal is received at which time a positive voltage will develop at the junction 206 and cause the transistor 82 to become nonconductive. This will "open" the actuated one of the switching circuits 64 and 66 and stop the bidirectional AC motor 20.

The input to the signal seeking system to cause the bidirectional motor 20 to run in the opposite direction is achieved by manual actuation of the switch 130 or by remote control of the voltage at the terminal 126. When the voltage at either one of these terminals is changed (brought to ground potential), a capacitor 224 begins to charge. The capacitor is maintained normally discharged by a resistor 227 which is connected in parallel with the capacitor. The charging path for the capacitor 224 is from the 5.1 volt supply at the terminal 146 through the capacitor and through either of the resistors 226 and 232 or 230 and 228 to ground, depending on which one of the terminals 124 and 126 is actuated. The terminal 126 is coupled to the 5.1 volt potential at terminal 146 by resistor 228 and resistor 233 to provide operating potential for the output stage of the remote circuits 52. The charging of the capacitor 224 causes the voltage at the junction 225 of the capacitor and the resistors 226 and 230 to begin to decrease such that, after a sufficient period of time, the transistor 234 will be biased into conduction. When the transistor 234 is conducting the 5.1 source of potential at the terminal 146 is applied through the emitter-collector current path of the transistor and a voltage divider including the resistors 236 and 238 to the base electrode of a transistor 240 whereby the transistor 240 is biased into conduction.

In a manner similar to that described in connection with the transistor 162, the conducting transistor 240 causes the diodes 242, 244 and 246 to become conductive. The diode 242 applies an input signal to the VHF tuning control system 88 to cause the VHF tuner 13 to switch to the UHF position and to cause a positive voltage to be applied to the base electrode of transistor 84. Conduction of the diode 244 triggers the monostable multivibrator 187 to produce a positive voltage pulse at the collector electrode of the transistor 190 which causes the normally nonconducting transistor 204 to become conductive for the duration of the positive voltage pulse. Thus, the terminal 206 is connected to ground through the collector-emitter current path of the transistor 204 and provides an input to the motor control portion of the system which overrides the signal sensing circuit output at the terminal 206 and causes the transistor 82 to be biased into conduction. At this time, a positive voltage applied to one of the leads 68 and 98 will actuate one of the motor switches 64 and 66.

Conduction of the diode 246 triggers the bistable multivibrator 179 by electrically connecting the base electrode of the transistor 178 to ground via the resistors 250 and 252. The transistor 178 becomes nonconductive and the transistor 176 becomes conductive. Conduction of the transistor 176 electrically connects the base electrode of a transistor 254 to ground through a resistor 256, the resistor 250, the collector-emitter current path of the transistor 176, and the diode 184. The transistor 254, which is normally biased off because of the voltage applied to its base electrode via the resistor 258, becomes conductive and connects to the 5.1 volt supply at the terminal 146 through the transistor's emitter-collector current path to the lead 98 thereby actuating the motor switch 66 and energizing the motor winding 58.

A transistor 272 is biased for conduction from the 5.1 volt supply at the terminal 146 via the resistors 274, 276, and 278. When the transistors 82 and 84 conduct, a diode 270 connected between the junction of resistors 274 and 276 and the collector electrode of transistors 82 becomes conductive, resulting in a change in bias which causes transistor 272 to become nonconductive. With transistor 272 nonconductive, the 30 volt supply at terminal 136 is coupled through a diode 284, a resistor 286, and a terminal 288 to the automatic fine tuning circuit 42. This voltage actuates circuits in the automatic fine tuning circuit 42 which prevents the application of a correction voltage to the UHF tuner oscillator. This is desirable because it prevents the AFT system from changing the oscillator frequency to offset the initial detuning of the UHF oscillator circuit from its last position (when the resonant circuits are tuned to receive an incoming UHF signal) by the motor 20. If the AFT correction were permitted to be applied to the oscillator, the initial retuning as the motor begins to run, would be compensated by the oscillator change.

The 30 volts developed at the collector electrode of the transistor 272 may also be used as a sensing voltage to actuate suitable means for muting the video and audio circuits during the period of time when the UHF system is seeking out the next succeeding television signal in the UHF frequency band.

Since most commercially available UHF tuners do not provide a 360° free turning shaft and are usually designed to provide approximately 180° of rotation, as for example, the KRK–132 UHF tuner used with the CTC–40 color television chassis, provision must be made for reversing the motor when the tuner shaft reaches the limit of its rotational range. Once the motor 20 begins to run it may drive the UHF tuner shaft from its last position to a tuner shaft rotational end stop. This will occur where no UHF signal is present over the portion of the UHF band between the last received UHF signal and the end of the band as determined by the signal sensing circuit 56. A switch, or a pair of switches, not shown, are provided in the UHF tuner for actuation when the tuning shaft rotates to its limit positions. The switches when actuated at the limit positions of the UHF tuning shaft couple one or the other of the conductors 290 and 292 to ground. The conductors 290 and 292 are connected to the terminals 294 and 296 of the motor control circuits.

When the tuning shaft of the UHF tuner 12 reaches one limit position, the conductor 292 and terminal 296 are grounded, so that after the time delay associated with the resistor 298 and capacitor 300, the diodes 302 and 304 become conductive. The diode 304 triggers the bistable multivibrator 179 causing the transistor 178 to become conductive and bias the transistor 180 into conduction in a manner previously described. This applies a positive potential to the lead 68 and causes the motor switch 64 to be actuated. Conduction of the diode 302 cuts off the transistor 190. As a result, the normally nonconducting transistor 204 is biased into conduction and holds the terminal 206 at a low potential until the tuner shaft has been driven away from its end stop position by the motor 20. This ensures that the motor will move away from its end stop position and provides protection against accidental damage to the tuner by forcing the tuner shaft against its rotational end stops. The motor will reverse direction and run until a UHF signal of sufficient strength is being received.

In a similar manner, a grounding of the conductor 290 and terminal 294, after a period of delay provided by the resistor 306 and capacitor 308, causes the diodes 310 and 312 to become conductive. The conduction of the diode 312 applies a ground potential to the bistable multivibrator 179 which causes the transistor 176 to become conductive and bias the transistor 254 into conduction. This applies a positive voltage on the lead 98 and causes the motor switch 66 to be actuated and the motor 20 to drive the tuner shaft in the opposite direction.

Once the bidirectional motor 20 is energized to drive the tuner shaft, the motor continues to run until the signal sensing circuitry 56 determines the presence of a desired UHF television signal. When a desired UHF signal is received, a positive voltage is developed at the terminal 206 which triggers the bistable multivibrator 213 and causes transistor 208 to become conductive. The low potential at the collector electrode of the transistor 208, as previously mentioned, is applied via the resistor 220 and the lead 222 to the base electrode of the transistor 82. The transistor 82 at this time becomes nonconductive and causes the actuated one of the motor switches 64 and 66 to be opened. That is, the path from the emitter electrodes of the switching transistors associated with the motor switches 64 and 66 are no longer connected electrically to ground and the transistors are, therefore, no longer biased into conduction, notwithstanding the fact that a positive voltage is applied to one of the leads 68 and 98. The motor windings are no longer energized and the motor 20 stops driving the tuner shaft, the UHF tuner 12 being set for reception of the incoming UHF television signal sensed by the signal sensing circuitry 56.

The signal sensing circuits provide a positive voltage to the terminal 206 when horizontal synchronizing information is derived from the sync separator; when a predetermined change in automatic fine tuning correction voltage occurs; and finally when a suitable level of automatic gain control voltage is present. When these three criteria are met, the transistor 314 is biased out of conduction and the transistor 316 is biased into conduction permitting a positive voltage to be developed at the collector electrode of the transistor 314 which is applied through the diode 320 to the terminal 206, causing the tuner motor to stop. When no UHF signal is being sensed by the signal sensing circuit 56, the transistor 314 is biased for conduction and the transistor 316 for nonconduction. It will be recognized that the transistors 314 and 316 comprise an AND gate for the presence of synchronizing information, AFT information, and automatic gain control information to provide a positive output when they simultaneously occur.

The sync separator 36 is connected to a terminal 322. In the CTC–40 series chassis, the terminal 322 may conveniently be connected via a 10 kilo-ohm resistor to terminal A on the PW 500 circuit board. The terminal 322 is coupled by a resistor network including the resistors 324, 236, and 328 to a tuned circuit 330. The tuned circuit 330 is tuned to 16.2 kHz., slightly above the horizontal sync pulse frequency. The tuned circuit 330, in conjunction with a diode 332 connected between the circuit and ground, provides peaking and shaping of the detected horizontal synchronizing pulses.

The voltage developed across the tuned circuit 330 and diode 332 is applied to the base electrode of a transistor 334 which is connected as an emitter follower to provide an impedance transformation. The output signal derived across the emitter follower's resistor 333 is applied across the series connected capacitor 336 and resistor 338. The resulting differentiated pulses appearing at the junction 337 of the capacitor 336 and resistor 338 is applied as a triggering pulse to the base electrode of a transistor 340 which is part of a monostable multivibrator 341. The monostable multivibrator 341 includes the transistor 340 and a transistor 342, with the interconnecting circuit components, a resistor 344 and a capacitor 346. Operating potential for the transistors 340 and 342 is derived from the 5.1 volt supply at the terminal 146 via the resistors 348 and 350. Bias to the base electrode of the transistor 342 is provided via a resistor 352 to cause that transistor to be normally conducting.

Thus the normally conducting transistor 42 is turned off for uniform periods of time (developing a positive voltage at its collector electrode) by the incoming horizontal sync pulse information. The positive voltage pulses developed at the collector electrode of the transistor 342 are coupled via a resistor 354 to the base electrode of a transistor 356 causing the transistor 356 to be periodically biased into conduction. Simultaneously, during the nonconducting periods of transistor 342 a normally charged capacitor 358 begins to discharge through the series connected resistors 360, 350 and 362. The capacitor 358 is normally maintained in its charged state by the current path from the 5.1 volt supply at the terminal 146, through the resistor 362, the capacitor 358, the resistor 360 and the collector-emitter current path of the normally conducting transistor 342 to ground.

After the monostable multivibrator 341 has been triggered a sufficient number of times, the integrating capacitor 358 will discharge to a level such that the voltage developed at the junction 349 of the capacitor 358 and resistor 360 is sufficiently positive to bias transistor 364 into conduction. The transistor 364 will remain conductive as long as the capacitor 358 remains sufficiently discharged. Thus, the junction 366 of the collector electrode of the transistor 364 and resistor 362 will be periodically connected to ground through the collector-emitter current path of the transistor 364 and the collector-emitter current path of the transistor 356, at the repetition rate determined by the output of the monostable multivibrator. That is, as long as horizontal synchronizing information continues to be provided at the terminal 322, the transistor 364 remains biased for conduction while the transistor 356 is periodically rendered conductive. It should be recognized that the integrating action of capacitor 358 keeps the transistor 364 cutoff until a predetermined number (approximately 30 for the component values shown in the drawings) of incoming horizontal sync pulses are received at which time the potential at the junction 366 will drop at a repetition rate determined by the incoming horizontal sync pulses and for a period of time determined by the time constant of monostable multivibrator 341.

The base electrode of the transistor 314 derives its bias, in part, from the junction 366 via the resistor 368. In addition, bias is provided to the base electrode of the transistor 314 from an 11 volt supply at the terminal 370 through a 3.3 volt Zener diode 372, a resistor 374, the emitter-collector current path of a transistor 376, and a resistor 378. The 11 volt supply at the terminal 370 may also be used as the source of operating potential for the AFT circuits 42 to minimize the effects of supply voltage variation on the AFT portion of the search system. Consequently, the transistor 314 will continue to be biased into conduction, even though horizontal sync pulses are being received, while the transistor 376 remains biased into conduction.

The base electrode of the transistor 376 is connected to the automatic fine tuning circuits 42 via the terminals 380 and 382 and the diodes 384 and 386. The automatic fine tuning circuits 42 are of the type used in the CTC–40 chassis, supra, and are described in a U.S. patent granted to Jack Avins, U.S. Pat. No. 3,444,477. The AFT circuits provided two output voltages each of which varies from approximately +2.0 volts to +11.0 volts in opposite senses. That is, when the IF signal is at the proper frequency in the IF pass band, i.e. at 45.75 mHz., the automatic fine tuning circuit provides a +6.5 output voltage at each of the AFT terminals 380 and 382. As the IF video carrier becomes progressively detuned in a first direction from 45.75 mHz., the AFT output voltage changes; the voltage at terminal 380 will vary from +6.5 volts to +11.0 volts and the voltage at terminal 382 will vary from +6.5 volts to +2.0 volts. When the detuning progresses beyond the AFT frequency pull-in range, each of the AFT outputs will return to +6.5 volts. If the IF signal becomes progressively detuned in a second direction from 45.75 mHz., the voltages at terminals 380 and 382 will be reversed. It should be understood that the AFT correction voltages referred to are the open loop voltages, the AFT voltage outputs where no correction voltage is being applied to the oscillator 16. The voltages developed by the AFT circuitry are shown adjacent the AFT circuits 42. One suitable system for obtaining open loop AFT voltages is disclosed in a U.S. Pat. application entitled, "Television System," filed June 2, 1969, Ser. No. 829,191, in the name of Wayne Wheeler Evans, and assigned to the RCA Corporation.

The 3.3 Zener diode 372 reduces the operating voltage at the emitter electrode of the transistor 376 to 7.7 volts. When the transistor 376 is conducting, a voltage of approximately 7.1 volts is established across the resistor 388. This voltage is established by the current flow through the emitter-base electrode current path of the transistor and the resistor 388 to ground. The voltage established at the base electrode of the transistor provides a cathode bias on the diodes 384 and 386. Consequently, when no incoming UHF TV signal is detected by the AFT circuits 42, +6.5 volts is developed at the terminals 380 and 382 and the diodes 384 and 386 are reverse biased.

As the UHF tuner is tuned across the UHF TV band an incoming signal detected by the automatic fine tuning circuits 42 and just falling within the AFT pull-in range causes the voltages at the terminals 380 and 382 to deviate from +6.5 volts in opposite direction toward +2 and +11 volts. The +11 volt AFT voltage will forward bias its associated diode. The voltage applied from the AFT terminal and through the forward biased diode will cutoff the transistor 376. The momentum of the motor 20, after the motor windings have been deenergized, will cause a further change in the tuning and bring the IF video carrier to 45.75 mHz. (the AFT circuit's discriminator crossover frequency).

Under the conditions where the transistor 376 is biased out of conduction, no voltage develops across the resistor 390 which will cause the transistor 314 to be biased into conduction. If, at this time, time junction 366 is periodically decreasing to ground potential the transistor 314 will periodically become nonconductive and a positive voltage can periodically develop at the collector electrode of the transistor 314 when the transistor 316 is conductive.

The transistor 316 will become conductive when a transistor 392 is biased into conduction. The transistor 392 has its base electrode coupled via a resistor 394 and a 9.1 volt Zener diode 396 to a terminal 398. The terminal 398 is coupled to the automatic gain control circuits 44. In the CTC–40 series chassis, as shown in the Television Service Data, supra, the terminal 398 may conveniently be connected to terminal 303 on the PW 300 circuit board. When an automatic gain control voltage develops and is applied at the terminal 398, (which for the CTC–40 chassis ranges from approximately +9.5 volts to +16 volts as the incoming UHF television signal voltage varies from a weak to strong signal) the voltage in excess of the 9.1 volt Zener diode voltage drop will be applied to the base electrode of the transistor 392. A filter is provided by a capacitor 400 and a resistor 402 to prevent kine arcs which may develop at the terminal 398 from biasing the transistor 392 into conduction. The emitter electrode of the transistor 392 is connected to a terminal 404 by an inductor 406. The inductor 406 in conjunction with a capacitor 408 provides protection against kine arc voltages which may develop in the system.

Terminal 404 is connected to a potentiometer 410 such that the bias applied to the emitter electrode of the transistor 392 may be adjusted to change the level of voltage at the base electrode required to cause the transistor 392 to become conductive. This in effect provides an adjustment for the level of automatic gain control voltage at the terminal 398 which is required to bias the transistor 392 into conduction. Since the AGC voltage increases with stronger incoming UHF television signals, it permits the viewer to prevent the transistor 392 from conducting when a weak TV signal is present. Thus, as the viewer sets increasing voltages at the emitter electrode of the transistor 392, it will be biased off except for stronger incoming UHF signals which produce a large AGC output voltage at the terminal 398. In this manner, the viewer can adjust the system to bypass weak signal UHF transmission during the searching operation by preventing the AGC input to the AND gate.

It should be noted that the preselector and oscillator tunable resonant circuits of the UHF tuner 12 are simultaneously varied in tracking relation such that a predetermined frequency difference (the IF frequency) is maintained between the resonant frequency of the preselector and the oscillator tunable resonant circuits. The oscillator component values are selected so that the oscillator tunable resonant circuit is resonant above the preselector circuit by the IF frequency for any given tuner shaft position. Since the preselector circuit attenuates signals outside of its band-pass, UHF TV signals located above the oscillator resonant frequency are attenuated.

Typically, UHF tuner preselector circuits provide an attenuation of signals outside its band-pass in the order of 40 to 50 decibels. The attenuation of these signals prevents the signal seeking circuitry from stopping on the image signal as it searches across the UHF TV frequency band. Moreover, the sensitivity adjustment as previously mentioned provides a level setting for incoming UHF TV signal strength necessary to stop the search system. Consequently, the viewer can adjust the sensitivity setting (potentiometer 410) such that received image signals, as attenuated by the preselector stage, are of insufficient strength to cause the signal seeking system to stop.

When the transistor 392 becomes conductive the current flowing through the resistor 412 turns on transistor 316. If the three previously mentioned criteria necessary to enable the AND gate (transistors 314 and 316) simultaneously occur, positive pulses develop at the collector electrode of the transistor 314 which are coupled through the diode 320 to the terminal 206. The first of these series of positive pulses causes the multivibrator to switch states so that the transistor 208 becomes conductive and remains conductive. The decreased voltage at the collector electrode of the transistor 208 is coupled via the resistor 220 and lead 222 to the base electrode of the transistor 82 causing it to become nonconductive and causing the actuated one of the motor switches 64 and 66 to become open thereby stopping the bidirectional AC motor 20 with the UHF tuner tuned for reception of the incoming UHF television signal detected by the signal sensing circuit 56. Loss of one or more of the three criteria caused, for example, by fading of the UHF TV signal, will not result in a reenergization of the motor windings since it is only the first positive pulse at the junction 206 which causes the actuated one of the motor switches 64 and 66 to become open.

What is claimed is:

1. A signal seeking tuning system for a superheterodyne receiver of the type including tuning circuits adjustable to tune said receiver for any signal in a frequency band, comprising:

control circuitry actuable to cause said tuning circuits to tune over said frequency band in one of a first and a second direction and responsive to a control signal to stop the tuning of said tuning circuits when a signal is received;

discriminator circuit means for detecting the superheterodyne receiver intermediate frequency, said discriminator circuit means including a first and a second output terminal providing a control voltage at each of said terminals having an amplitude which varies with frequency over a predetermined limited range of frequencies, and having a relatively constant amplitude outside said range of frequencies, the control voltage amplitude at the approximate center of said range of frequencies indicating the desired intermediate frequency;

means including a device coupled to said control circuitry, said device having a control electrode coupled by circuit means to said discriminator circuit means first and second output terminals;

the conductivity of said device changing to generate said control signal when said tuning circuits are caused to tune over said frequency band in said first direction such that the amplitude of said control voltage has varied by a predetermined amount; and the conductivity of said device changing to generate said control signal when said tuning circuits are caused to tune over said frequency band in said second direction such that the amplitude of said control voltage is varied by a predetermined amount.

2. A signal seeking system as defined in claim 1 wherein said circuit means includes a first and a second DC steering diode such that said device will be biased to change conductivity when said tuning circuits are adjusted to cause the superheterodyne receiver intermediate frequency to be within said range of frequencies.

3. A signal seeking system as defined in claim 2 wherein said device is a transistor.

4. A signal seeking system as defined in claim 3 including a Zener diode coupled in series with the collector-emitter current path of said transistor.

5. A signal seeking tuning system for a television receiver, comprising:

tuning means for scanning the frequency spectrum and selecting any one of a plurality of television channels, said tuning means including a variable capacitive element for fine tuning adjustments;

automatic fine tuning control circuitry providing a control output voltage coupled to said variable capacitive element to vary the capacitance exhibited by said variable capacitive element such that said tuning means is adjustable to have a pull-in capability over a predetermined range of frequencies to insure proper adjustment of said tuning means;

mechanical driving means coupled to drive the tuning means to scan through the frequency spectrum;

a control circuit means coupled to deenergize the driving means to stop said tuning means when said control circuit means are actuated by a control signal; and means responsive to (1) the presence of synchronizing pulses, (2) the presence of a predetermined level of automatic gain control voltage, and, (3) the presence of said control output voltage from the automatic fine tuning control circuitry indicating that the receiver is tuned to a frequency within the pull-in capability of the automatic fine tuning control circuitry to insure that said tuning means is adjusted so that proper tuning can be achieved by varying the capacitance of said variable capacitance element, for applying a control signal to said circuit means, said control circuit means actuated by said control signal to deenergize the driving means to stop said tuning means before said tuning means is accurately tuned to a selected television channel, and the inertia of said mechanical driving means causing a further change in said tuning means in the direction for accurate tuning for the selected channel.

6. A signal seeking system as defined in claim 5 wherein said automatic fine tuning control circuitry is of the type providing a control voltage having an amplitude which varies with frequency over a predetermined limited range of frequencies, and having a relatively constant amplitude outside said range of frequencies, the control voltage amplitude at the approximate center of said range of frequencies indicating a desired signal.

7. A signal seeking system as defined in claim 6 wherein said means is responsive to a change in the level of said control voltage.

8. A signal seeking system as defined in claim 7 wherein said means is responsive to a predetermined amount of change in the level of said control voltage.

9. A signal seeking system as defined in claim 8 wherein said synchronizing pulses are horizontal synchronizing pulses.

10. A signal seeking tuning system for a superheterodyne receiver of the type including tuning circuits adjustable to tune said receiver for any signal in a frequency band, comprising:

control circuitry adjustable to cause said tuning circuits to tune over said frequency band in one of a first and a second direction and responsive to a control signal to stop the tuning of said circuits when said control signal is received;

discriminator circuit means for detecting the superheterodyne receiver intermediate frequency and including a first and second output terminal each providing an output voltage having an amplitude which varies with frequency over a predetermined limited range of frequencies, and having a relatively constant amplitude outside said range of frequencies, the voltage amplitude at the approximate center of said range of frequencies indicating the desired intermediate frequency;

a three terminal device including a first, a second and a control electrode;

a first and a second diode having like electrodes coupled to the control electrode of said device, the other electrode of said first diode coupled to the first discriminator output terminal and the other electrode of said second diode coupled to the second discriminator output terminal;

a first impedance means coupled between the control electrode of said device and a point of reference potential, a second impedance means coupled between the first electrode of said device and said point of reference potential, said first electrode further coupled to said control circuitry to generate said control signal by changes in conductivity of the first-second electrode current path of said device; and means providing a source of operating potential for said device coupled to the second electrode of said device, said operating potential of a magnitude such that in conjunction with said relatively constant amplitude output voltage at said first and said second discriminator output terminals, said device is biased so that said device first-second electrode current path exhibits a first conductivity and in conjunction with said output voltage at said first and said second discriminator output terminals over a part of said range of frequencies, said device is biased so that said device first-second electrode current path exhibits a second conductivity.

11. A signal seeking system as defined in claim 10 wherein said output voltage at said first and said second discriminator output terminals is a differential output voltage.

* * * * *

UNITED STATES PATENT OFFICE
CERTIFICATE OF CORRECTION

Patent No. 3,632,864 Dated January 4, 1972

Inventor(s) Wayne Wheeler Evans

It is certified that error appears in the above-identified patent and that said Letters Patent are hereby corrected as shown below:

In Column 3, line 17, delete "only" and insert -- other --. Column 9, line 17, delete "236" and insert -- 326 --; line 41, delete "42" and insert -- 342 --. Column 11, line 1, delete "time" (second occurrence) and insert -- the --.

Signed and sealed this 19th day of December 1972.

(SEAL)
Attest:

EDWARD M.FLETCHER,JR.
Attesting Officer

ROBERT GOTTSCHALK
Commissioner of Patents

ORM PO-1050 (10-69)
530 6|72
USCOMM-DC 60376-P69
☆ U.S. GOVERNMENT PRINTING OFFICE 1969 O—366-334